United States Patent
Zhang et al.

(10) Patent No.: US 10,306,673 B2
(45) Date of Patent: May 28, 2019

(54) C-RAN FRONT-END PREPROCESSING AND SIGNALING UNIT

(71) Applicant: Intel Corporation, Santa Clara, CA (US)

(72) Inventors: Zhiyuan Zhang, Beijing (CN); Qianying Zhu, Beijing (CN); Xinxin Zhang, Beijing (CN); Shunyu Zhu, Beijing (CN); Xiangbin Wu, Beijing (CN); Xuebin Yang, Beijing (CN); Senjie Zhang, Beijing (CN); Guangjie Li, Beijing (CN); Xu Zhang, Beijing (CN)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 15/300,042

(22) PCT Filed: May 12, 2014

(86) PCT No.: PCT/CN2014/077274
§ 371 (c)(1),
(2) Date: Sep. 28, 2016

(87) PCT Pub. No.: WO2015/172290
PCT Pub. Date: Nov. 19, 2015

(65) Prior Publication Data
US 2017/0251493 A1    Aug. 31, 2017

(51) Int. Cl.
| | |
|---|---|
| H04W 74/00 | (2009.01) |
| H04L 27/26 | (2006.01) |
| H04L 5/00 | (2006.01) |
| H04W 56/00 | (2009.01) |
| H04W 74/08 | (2009.01) |
| H03M 7/30 | (2006.01) |
| H04W 88/08 | (2009.01) |

(52) U.S. Cl.
CPC .......... *H04W 74/002* (2013.01); *H03M 7/30* (2013.01); *H04L 5/0007* (2013.01);
(Continued)

(58) Field of Classification Search
CPC ... H04W 74/002; H04L 5/0007; H04L 5/0048
See application file for complete search history.

(56) References Cited

U.S. PATENT DOCUMENTS

| | | | |
|---|---|---|---|
| 2012/0208584 A1 | 8/2012 | Liao | |
| 2012/0281565 A1* | 11/2012 | Sauer | H04W 64/00 370/252 |

(Continued)

FOREIGN PATENT DOCUMENTS

| | | |
|---|---|---|
| CN | 102291855 A | 12/2011 |
| CN | 102546080 A | 7/2012 |

(Continued)

OTHER PUBLICATIONS

Lorca, J et al., "Lossless compression technique for the fronthaul of LTE/LTE-advanced cloud-RAN architectures", 2013 IEEE 14th International symposium on a world of wireless, mobile and multimedia networks (WOWMOM), IEEE, DOL: 10.1109/WOWMOM. 2013.6583374 Aug. 20, 2013, (Jun. 4, 2013), 1-9.*

(Continued)

*Primary Examiner* — Siming Liu
(74) *Attorney, Agent, or Firm* — Schwegman Lundberg & Woessner, P.A.

(57) ABSTRACT

A front-end unit that operates within a C-RAN architecture to perform the functions of cellular signal processing and resource selection between an RRU and the BBU pool network is described. The front-end unit supports flexible load migration and CoMP (coordinated multipoint) in the CRAN BBU while also reducing data transmission within the BBU pool network or between the BBU pool network and the RRU.

20 Claims, 3 Drawing Sheets

(52) U.S. Cl.
CPC ........ *H04L 5/0048* (2013.01); *H04L 27/2607* (2013.01); *H04L 27/2626* (2013.01); *H04L 27/2628* (2013.01); *H04L 27/2647* (2013.01); *H04W 56/001* (2013.01); *H04W 74/0833* (2013.01); *H04W 88/085* (2013.01); *H03M 7/3068* (2013.01)

(56) References Cited

U.S. PATENT DOCUMENTS

| | | | |
|---|---|---|---|
| 2014/0226736 A1 | 8/2014 | Niu et al. | |
| 2015/0282105 A1* | 10/2015 | Harel | H04W 52/52 370/329 |

FOREIGN PATENT DOCUMENTS

| | | |
|---|---|---|
| CN | 102546504 A | 7/2012 |
| CN | 103546402 A | 1/2014 |
| CN | 103731884 A | 4/2014 |
| CN | 106465470 A | 2/2017 |
| WO | WO-2012139781 A1 | 10/2012 |
| WO | WO-2013048526 A1 | 4/2013 |
| WO | WO-2013174544 A1 | 11/2013 |
| WO | WO-2015172290 A1 | 11/2015 |

OTHER PUBLICATIONS

"European Application Serial No. 14891810.5, Extended European Search Report dated Dec. 6, 2017", 9 pgs.

Lorca, J, et al., "Lossless compression technique for the fronthaul of LTE/LTE-advanced cloud-RAN architectures", 2013 IEEE 14th International Symposium on a World of Wireless, Mobile and Multimedia Networks (WOWMOM), IEEE, DOI: 10.1109/WOWMOM.2013.6583374 ISBN: 978-1-4673-5827-9 [retrieved on Aug. 20, 2013], (Jun. 4, 2013), 1-9.

"International Application Serial No. PCT/CN2014/077274, International Search Report dated Feb. 17, 2015", 4 pgs.

"International Application Serial No. PCT/CN2014/077274, Written Opinion dated Feb. 17, 2015", 5 pgs.

"Japanese Application Serial No. 2016-567496, Office Action dated Mar. 6, 2018", w/ English translation, 6 pgs.

"European Application Serial No. 14891810.5, Response filed Jun. 27, 2018 to Extended European Search Report dated Dec. 6, 2017", 20 pgs.

"Evolved Universal Terrestrial Radio Access (E-UTRA); Physical channels and modulation", 3GPP TS 36.211 V12.0.0. Technical Specification Group Radio Access Network. Release 12., (Dec. 2013), 120 pgs.

"Japanese Application Serial No. 2016-567496, Response filed Jun. 1, 2018 to Office Action dated Mar. 6, 2018", w/ English Claims, 16 pgs.

"Korean Application Serial No. 2016-7028239, Notice of Preliminary Rejection dated Apr. 26, 2018", w/ English translation, 12 pgs.

"Korean Application Serial No. 2016-7028239, Response filed Jun. 26, 2018 to Notice of Preliminary Rejection dated Apr. 26, 2018", w/ English claims, 16 pgs.

"Chinese Application Serial No. 201480077956.X, Office Action dated Mar. 11, 2019", w/English Translation, 22 pgs.

"European Application Serial No. 14891810.5, Response filed Jan. 14, 2019 to Communication Pursuant to Article 94(3) EPC dated Sep. 7, 2018", 15 pgs.

\* cited by examiner

C-RAN FRONT-END PREPROCESSING AND SIGNALING UNIT

This application is a U.S. National Stage Application under 35 U.S.C. 371 from International Application No. PCT/CN2014/077274, filed May. 12, 2014, which is hearby incorporated by reference in its entirety.

TECHNICAL FIELD

Embodiments described herein relate generally to wireless networks and communications systems.

BACKGROUND

C-RAN (cooperative or cloud radio access network) is a next generation wireless network infrastructure being actively explored by the cellular communication industry worldwide, aiming at greatly reducing the total cost of ownership of operators by using centralized BBU (baseband unit) processing and remotely connected RRUs (remote radio units). In order to realize the full advantages of C-RAN, however, there are still challenges that remain to be addressed, including cost-effective long distance fiber connections, scalable BBUs, dynamic load sharing, and fault tolerance. These are among the concerns of the present disclosure.

DETAILED DESCRIPTION

Described herein is a front-end unit that operates within a C-RAN architecture to perform the functions of cellular signal processing and resource selection between an RRU and the BBU pool network. The described front-end unit supports flexible load migration and CoMP (coordinated multipoint) in the CRAN BBU while also reducing data transmission within the BBU pool network or between the BBU pool network and the RRU.

C-RAN Architecture

Figure 1:
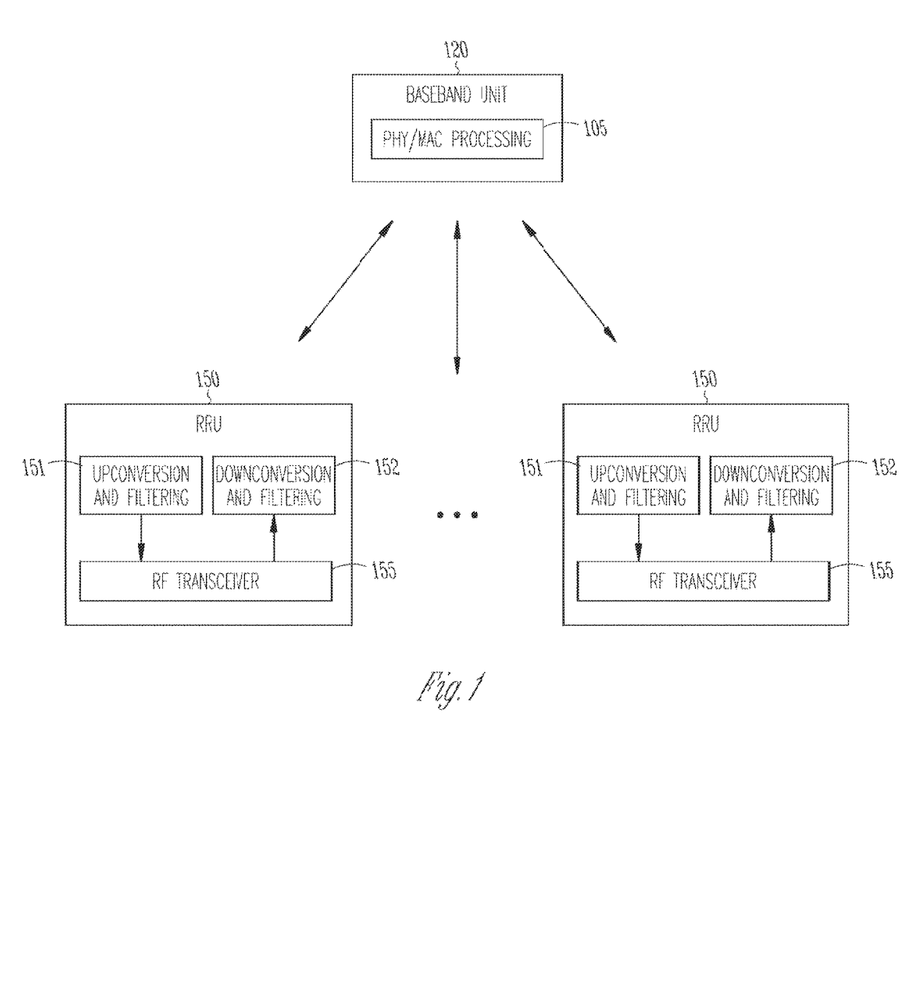
FIG. 1 illustrates an example of a C-RAN architecture.

In a traditional Long Term Evolution (LTE) network, a stand-alone base station (referred to as an evolved Node B or eNB) provides a static coverage area or cell for terminals (referred to as user equipment or UEs). A C-RAN modifies this configuration in order to provide increased energy efficiency and collaboration. As shown in FIG. 1, one or more remote radio units (RRUs) 150 transfer digital complex-baseband wireless signals to/from a pool of one or more baseband units (BBUs) 120. The baseband sample data may be transferred, for example, over common public radio interface (CPRI) fiber-optic links. The BBU as indicated by module 105 performs physical layer (PHY) and medium access control layer (MAC) processing of baseband data. The RRU 150 performs upconversion/filtering 151 of the baseband data received from the BBU for radio frequency (RF) transmission by RF transceiver 155 and performs downconversion/filtering 152 of signals received from RF transceiver 155.

LTE Physical Layer

LTE downlink signals are modulated using orthogonal frequency division multiple access (OFDMA), and uplink signals are modulated using a related technique, single carrier frequency-division multiple access (SC-FDMA). For both the downlink and the uplink, digital data is modulated into complex-valued symbols according to a modulation scheme such as QAM (quadrature amplitude modulation) before OFDMA modulation. In the case of SC-FDMA, the symbols are further pre-coded with a discrete Fourier transform (DFT), sometimes called DFT spreading. For both the uplink and down link, an inverse fast Fourier transform (IFFT) is applied to these symbols, referred to as frequency-domain symbols, in order to map the frequency-domain symbols in different OFDMA/SC-FDMA subcarriers and a cyclic prefix is then added to generate an OFDMA or SC-FDMA symbol. The OFDMA or SC-FDMA symbol is a series of complex-valued time-domain samples that correspond to the sum of the subcarriers to which the frequency-domain symbols are mapped. Because the complex-valued time-domain samples are upconverted to in-phase and quadrature RF carriers by the RRU, the real and imaginary parts of the complex-valued symbols in either the time or frequency domain may be referred to as I and Q components, respectively, with the complex-valued samples referred to as IQ samples.

A particular OFDMA/SC-FDMA subcarrier transmitted during an OFDMA/SC-FDMA symbol is the smallest time-frequency resource in LTE and is referred to as a resource element (RE). LTE also provides for MIMO (multi-input multi-output) operation where multiple layers of data are transmitted and received by multiple antennas and where each of the complex modulation symbols is mapped into one of the multiple transmission layers and then mapped to a particular antenna port. Each RE is then uniquely identified by the antenna port, sub-carrier position, and OFDM symbol index within a radio frame, where a radio frame has a duration of 10 ms. Each radio frame consists of 10 sub-frames, and each sub-frame consists of two consecutive 0.5 ms slots. Each slot comprises six indexed OFDM symbols for an extended cyclic prefix and seven indexed OFDM symbols for a normal cyclic prefix. A group of resource elements corresponding to twelve consecutive subcarriers within a single slot is referred to as a resource block (RB). LTE may operate in different bandwidths corresponding to different RF carrier spectrums and operates with empty subcarriers in approximately 20 percent of the spectrum at the upper and lower band edges referred to as guard subcarriers.

LTE defines transport channels that carry data between the MAC and PHY layers, and these transport channels are mapped to physical layer channels which are then mapped to specific time-frequency resources. The downlink and uplink transport channels for data transmission are the downlink shared channel (DL-SCH) and uplink shared channel (UL-SCH), respectively, which are mapped to the physical downlink shared channel (PDSCH) and physical uplink-shared channel (PUSCH), respectively. Physical channels are also defined for carrying control information to and from the MAC layer. For the downlink, these include: the physical downlink control channel (PDCCH) which carries downlink control information (DCI) that includes resource allocations to the UE, the physical hybrid automatic repeat request indicator channel (PHICH), the physical control format indicator channel (PCFICH) and the physical broadcast channel (PBCH). For the uplink, they include the physical uplink control channel (PUCCH) which carries uplink control information (UCI) that includes scheduling requests and date transmission acknowledgements and the physical random access channel (PRACH) used for initial access of a UE to the network through transmission of random access preambles. In addition, LTE defines physical signals that map to specific REs but do not carry information originating from higher layers. These include reference signals (RSs), the primary synchronization signal (PSS), and the secondary synchronization signal (SSS).

Front-end Unit

The front-end unit as described herein is a hardware unit between the RRU and the BBU pool network and may be located either inside the RRU or in the BBU pool network. The front-end unit transforms uplink time-domain signal samples received from the RRU to the frequency domain via a fast Fourier transform (FFT) and transforms frequency-domain data received from the BBU to downlink time-domain signal samples via an inverse fast Fourier transform (IFFT). The front-end unit may also perform channel based frequency-domain data selection, distribution and compression where each downlink and uplink channel is divided and conquered with different compression and encoding methods to reduce bandwidth requirements and may be configured so that only useful channels and RBs are transmitted in BBU pool network. The front-end unit may be controlled by the BBU server at every sub-frame interval (1 ms) with downlink control signaling (DCS) and uplink control signaling (UCS). This signaling mechanism enables flexible migration and facilitates CoMP in the BBU pool.

The front-end unit greatly reduces bandwidth requirements by picking up control channels (e.g., PDCCH, PHICH, PBCH, PSS, SSS, and RS) raw data and valid data channels (i.e., the PDSCH and PUSHC) RBs to form a BBU pool network packet. The front end unit recovers IQ samples from the above payload. Table 1 below shows the comparison of downlink bandwidth requirements of one 20 MHz 8 antenna LTE cell with and without a front-end unit.

TABLE 1

|  | CPRI IQ data raw bandwidth (Mbps) | w/front-end unit bandwidth (Mbps) |
|---|---|---|
| System Fully Idle | 7864 | 7.2 |
| System 50% load | 7864 | 1075 |
| System 100% load | 7864 | 2150 |

When the front-end unit is located in the RRU, it significantly reduces the long-distance transmission, requirement between the remote RRU and the CRAN BBU pool. The front-end unit also has the advantage of being able to change each occupied RB's destination BBU servers address at every sub-frame boundary so as to enable both fast load migration and flexible CoMP support. When BBUs are immigrating to and from the BBU server pool, the front-end unit may continue to send broadcasting and synchronization channels to the RRU without any incoming data from server which helps to make such BBU immigration transparent to an end user.

Figure 2:
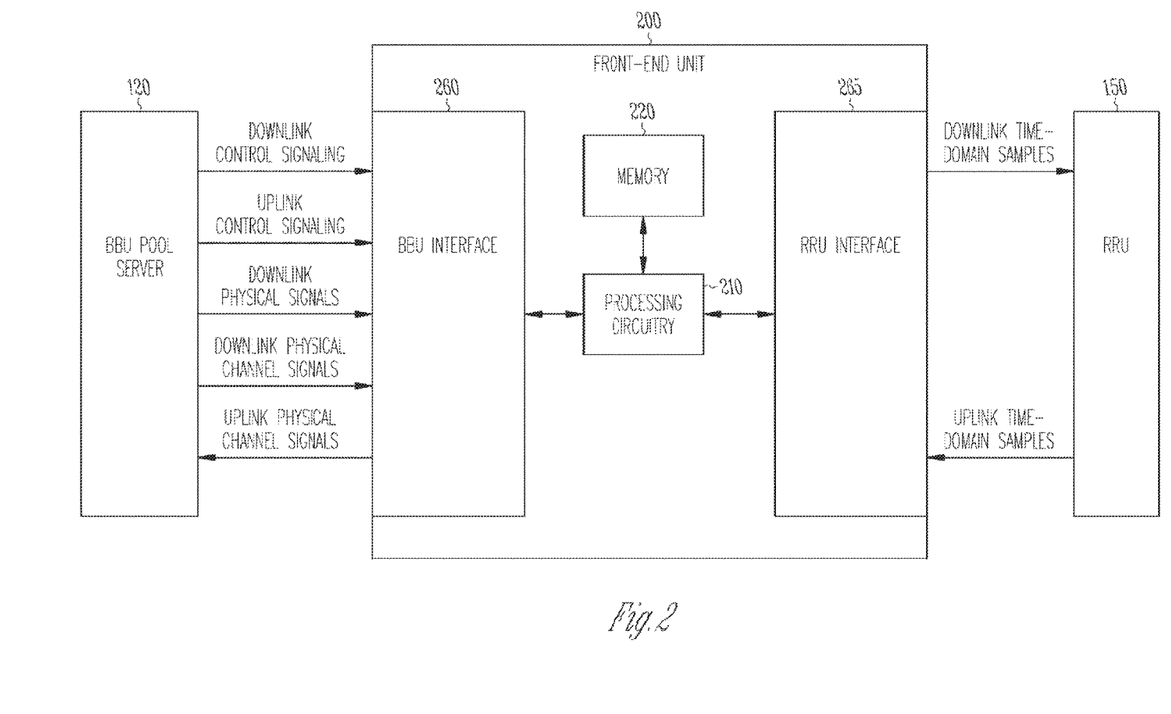
FIG. 2 depicts an example front-end unit.

FIG. 2 illustrates an example embodiment of a front-end unit 200 that includes processing circuitry 210, memory 220, a BBU interface 260 for communicating with a BBU pool server 120, and an RRU interface 265 for communicating with an RRU 150. The BBU pool network interface 260 may be used to connect the front-end unit to the BBU server pool via Ethernet or other network technology. The operation of the processing circuitry 210 is controlled by the BBU pool server via downlink control signaling (DCS) and uplink control signaling (UCS) which may be transmitted on a per subframe basis. The front-end unit 200 may be integrated with a BBU pool server or integrated with an RRU. When the front-end unit is located in the BBU pool network, the RRU interface 265 may be an CPRI interface, while the RRU interface 265 may be an RRU internal interface if the front-end unit is integrated with the RRU.

In one embodiment, the processing circuitry 210 stores downlink physical signals received from the BBU pool server in memory 220. The downlink physical signals stored in memory may include reference signals (RSs), a primary synchronization signal (PSS), and a secondary synchronization signal (SSS). For downlink processing, the processing circuitry may be further to receive downlink physical channel data and downlink control signalling (DCS) from the BBU pool server, map the physical channel data to resource elements (REs) in accordance with the DCS along with the downlink physical signals retrieved from memory, OFDMA (orthogonal frequency division multiple access) modulate the REs to downlink time-domain samples, and transmit the downlink time-domain samples to the RRU. For uplink processing, the processing circuitry 210 may be further to receive uplink time-domain samples from the RRU, extract uplink physical channel REs therefrom in accordance with uplink control signalling (UCS) received from the BBU pool server, and transmit the uplink physical channel REs to a destination BBU pool server as specified by the UCS. OFDMA modulation of REs to downlink time domain samples may be performed by performing an inverse fast Fourier transform (IFFT) on the REs belonging to an OFDMA symbol and adding a cyclic prefix. Extraction of uplink physical channel REs from received uplink time domain samples may be performed by performing a half-carrier shift (HCS) and a fast Fourier transform (FFT) on REs belonging to a single carrier frequency-division multiplexing (SC-FDMA) symbol with removal of a cyclic prefix. In one embodiment, the processing circuitry 210 receives and stores the RSs, PSS, and SSS as unmodulated data. The RSs, PSS, and SSS are then modulated for mapping to REs according to the LTE radio frame number. The processing circuitry 210 may continue transmitting downlink time-domain samples representing the RSs, PSS, and SSS to the RRU for subframes for which no DCS is received.

For downlink processing in one embodiment, the downlink physical channel data received by the processing circuitry 210 from the BBU pool server 120 includes modulated and compressed complex-valued frequency-domain samples of the physical downlink shared channel (PDSCH) and unmodulated data corresponding to the physical downlink control channel (PDCCH). The processing circuitry 210 then decompresses the downlink PDSCH samples received from the BBU pool server before mapping them to REs. In one embodiment, the compressed PDSCH samples are 16-bit complex numbers with an 8-bit in-phase component and an 8-bit quadrature component. The processing circuitry 210 may also receive from the BBU pool server and store in memory unmodulated physical broadcasting channel (PBCH) data. The PBCH data may then be retrieved and modulated for mapping in REs when indicated by the DCS for a given subframe.

For uplink processing in one embodiment, the processing circuitry 210 compresses the uplink time-domain samples belonging to a physical uplink shared channel (PUSCH) before transmitting them to the RRU where the compressed PUSCH samples are 16-bit complex numbers with an 8-bit in-phase component and an 8-bit quadrature component. In one embodiment, the processing circuitry 210 also performs automatic gain control (AGC) on the received uplink time-domain samples in accordance with an AGC coefficient included in the UGS. The processing circuitry may also, if a physical random access channel (PRACH) is enabled in a subframe as indicated by the UCS, extract PRACH data from the received time-domain samples and send the PRACH data to the BBU pool server. The PRACH data may be compressed before being sent to the BBU pool server.

Figure 3:
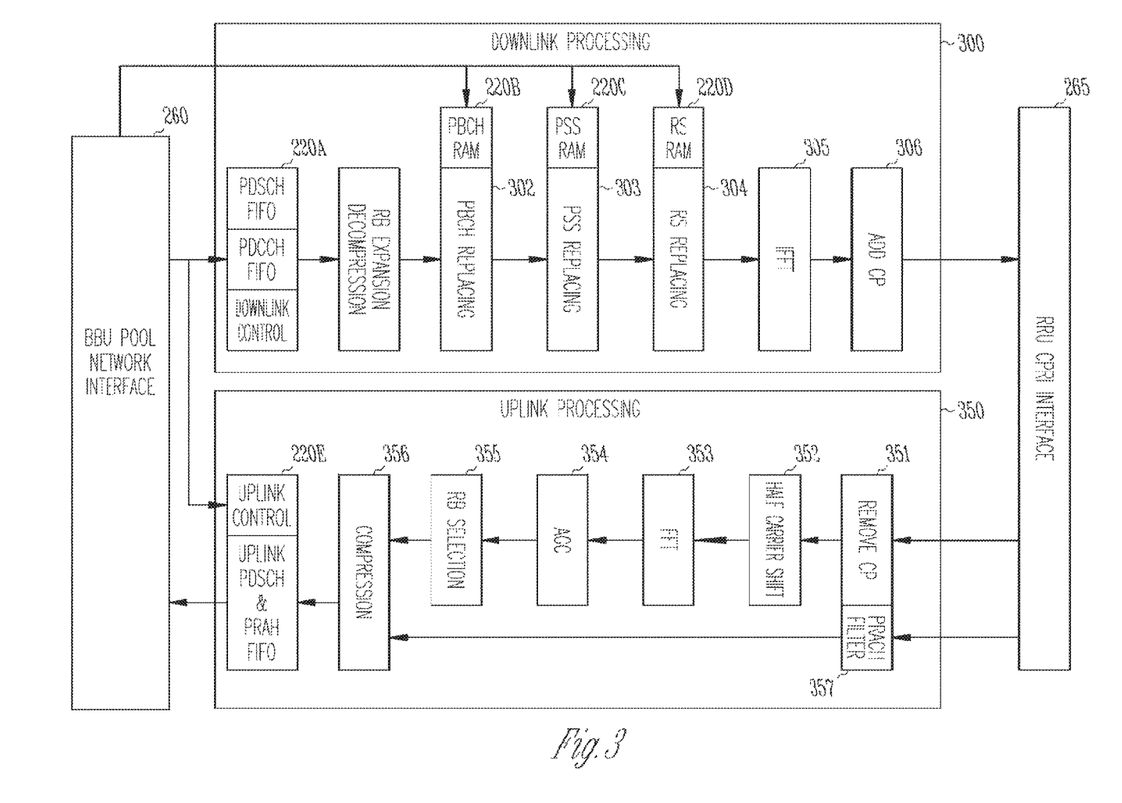
FIG. 3 illustrates the uplink and downlink processing performed by the front-end unit.

FIG. 3 illustrates in more detail the downlink and uplink processing functionalities of the front-end unit in one embodiment as represented by downlink processing module 300 and uplink processing module 350. The processing modules use the same processing and signaling mechanisms whether the front-end unit is located in the BBU pool or the RRU. As will be described, both the downlink and uplink processing modules utilize specific random access memories (RAMs) 220a through 220c that may be regarded as areas of memory 200 in FIG. 2 for storage of control signaling, physical channel data, and physical signals.

Referring first to downlink processing module 300, the DCS for the next subframe as received from the BBU server is stored in memory 220a. The DCS includes the PDSCH occupancy and compression method and the replacing command for the PDCCH/PBCH channels. Also stored in memory 220a are PDCCH and PDSCH data. The BBU server may send compressed PDSCH code to the front-end unit, where each RE sample is compressed to 16 bits (8 bit I and 8 bit Q) in the BBU server and only occupied RBs are transmitted. Module 301 performs RB decompression and expansion according to the subframe's DCS. BBU server may send a raw (i.e., unmodulated) PDCCH payload to the front-end (which consumes about 7.2 Mbps of network bandwidth). The front-end unit may then perform QPSK modulation for the PDCCH on each antenna, respectively. The BBU server may fill the RS RAM 220d and the PSS RAM 220c with un-modulated raw data, which information would normally be static and invariant across subframes once the BBU is setup. Modules 303 and 304, respectively, modulate the raw data inside PSS and RS RAM and perform RB replacement based on LTE radio frame number. When there is no coming control and PDCCH/PDSCH data from BBU during BBU migration period, the front-end unit may continue sending PSS/RS signals based on theradio frame number to maintain a UE's connection with the BBU. The BBU server may also fill the PBCH RAM 220b with un-modulated raw data when the PBCH is available in a given subframe. Module 302 modulates the raw data inside the PBCH RAM and replaces the corresponding RBs according to the DCS. After the physical channel and physical signal data has been mapped to RBs, modules 305 and 306 perform the IFFT and cyclic prefix addition generate time-domain samples that are transmitted to the RRU.

In the uplink processing module 350, the UCS is sent by the BBU server several subframes ahead of the uplink radio subframe that is to be processed, where the UCS may include die PUSCH RB occupancy, automatic gain control (AGC) coefficient, destination, server index for each occupied RB, and the processing command for the PRACH channel. The UCS is stored in memory area 220e. Time domain samples from the RRU are processed with removal of the cyclic prefix by module 351, a half-subcarrier shift (HCS) by module 352 to remove the DC subcarrier, and an FFT by module 353 to transform the samples to the frequency domain. Time domain samples of the PRACH are filtered separately by module 357. Module 354 performs AGC for each RB according to an AGC coefficient given in the UCS. Only valid RBs received from the RRU may be processed to extract the PUSCH and, if present, the ePRACH according to the UCS. Each PUSCH RE sample may then be compressed by module 355 to 16 bits (8 bit I and 8 bit Q) and stored in memory area 220e with the PRACH. Each RB can be sent to different BBU server according to the UCS, and the destination can be changed at the end of each subframe to enable flexible load migration and facilitation of CoMP in the BBU Pool. If the PRACH is enabled in a sub-frame as indicated by the UCS, compressed PRACH data may also be sent to BBU server.

Additional Notes and Examples

In Example 1, a method for operating a front-end unit in an LTE (Long Term Evolution) network, comprises: communicating with a base-band unit (BBU) pool server and with a remote radio unit (RRU); storing downlink physical signals as received from the BBU pool server; receiving downlink physical channel data and downlink control signalling (DCS) from the BBU pool server, mapping the downlink physical channel data to resource elements (REs) in accordance with the DCS along with the downlink physical signals retrieved from memory, OFDMA (orthogonal frequency division multiple access) modulating the REs to downlink time-domain samples, and transmitting the downlink time-domain samples to the RRU: and, receiving uplink time-domain samples from the RRU, extracting uplink physical channel REs therefrom in accordance with uplink control signalling (UCS) received from the BBU pool server, and transmitting the uplink physical channel REs to a destination BBU pool server as specified by the UCS.

In Example 2, the subject matter of Example 1 may optionally include OFDMA modulating the REs to downlink time domain samples by performing an inverse first Fourier transform (IFFT) on the REs belonging to an OFDMA symbol and adding a cyclic prefix.

In Example 3, the subject matter of Example 1 may optionally include extracting uplink physical channel REs from received uplink time domain samples by performing a half-carrier shift (HCS) and a fast Fourier transform (FFT) on REs belonging to a single carrier frequency-division multiplexing (SC-FDMA) symbol with removal of a cyclic prefix.

In Example 4, the subject matter of Example 1 may optionally include wherein the downlink physical signals stored in memory include reference signals (RSs), a primary synchronization signal (PSS), and a secondary synchronization signal (SSS).

In Example 5, the subject matter of Example 4 may optionally include: receiving and storing the RSs, PSS, and SSS as unmodulated data; and, modulating the RSs, PSS, and SSS for mapping to REs according to the LTE radio frame number.

In Example 6, the subject matter of Example 4 may optionally include continuing to transmit downlink time-domain samples representing the RSs, PSS, and SSS to the RRU for subframes for which no DCS is received.

In Example 7, the subject matter of Example 1 may optionally include wherein the downlink physical channel data includes modulated and compressed complex-valued frequency-domain samples of a physical downlink shared channel (PDSCH) and unmodulated data corresponding to a physical downlink control channel (PDCCH).

In Example 8, the subject matter of Example 7 may optionally include decompressing the downlink PDSCH samples received from the BBU pool server before mapping them to REs.

In Example 9, the subject matter of Example 8 may optionally include wherein the compressed PDSCH samples are 16-bit complex numbers with an 8-bit in-phase component and an 8-bit quadrature component.

In Example 10, the subject matter of Example 1 may optionally include compressing the uplink time-domain samples belonging to a physical uplink shared channel (PUSCH) before transmitting them to the RRU and wherein the compressed PUSCH samples are 16-bit complex numbers with an 8-bit in-phase component and an 8-bit quadrature component.

In Example 11, the subject matter of Example 1 may optionally include performing automatic gain control (AGC) on the received uplink time-domain samples in accordance with an AGC coefficient included in the UGS.

In Example 12, the subject matter of Example 1 may optionally include, if a physical random access channel (PRACH) is enabled in a subframe as indicated by the UCS, extracting PRACH data from the received time-domain samples and send the PRACH data to the BBU pool server.

In Example 13, the subject matter of Example 12 may optionally include compressing the PRACH data before sending to the BBU pool server.

In Example 14, the subject matter of Example 1 may optionally include receiving DCS and UCS per LTE subframe.

In Example 15, the subject matter of Example 1 may optionally include: receiving from the BBU pool server and store in memory unmodulated physical broadcasting channel (PBCH) data; and, modulating the PBCH data for mapping to REs when indicated by the DCS for a given subframe.

In Example 16, a front-end unit to operate in an LTE (Long Term Evolution) network, comprises: interfaces to communicate with a base-band unit (BBU) pool server and with a remote radio unit (RRU); processing circuitry with an associated memory for storing downlink physical signals as received from the BBU pool server, wherein the processing circuitry is to: receive downlink physical channel data and downlink control signalling (DCS) from the BBU pool server, map the downlink physical channel data to resource elements (REs) in accordance with the DCS along with the downlink physical signals retrieved from memory, OFDMA (orthogonal frequency division multiple access) modulate the REs to downlink time-domain samples, and transmit the downlink time-domain samples to the RRU: and, receive uplink time-domain samples from the RRU, extract uplink physical channel REs therefrom in accordance with uplink control signalling (UCS) received from the BBU pool server, and transmit the uplink physical channel REs to a destination BBU pool server as specified by the UCS.

In Example 17, the subject matter of Example 16 may optionally include wherein the front-end unit is integrated with the BBU pool server.

In Example 18, the subject matter of Example 16 may optionally include wherein the front-end unit is integrated with the RRU.

In Example 19, the subject matter of Example 16 may optionally include wherein the processing circuitry is to perform according to the subject matters of any of Examples 1 through 15.

In Example 20, a computer-readable medium contains instructions for performing any of the methods of Examples 1 through 15.

In Example 21, a front-end unit comprises means for performing any of the methods of Examples 1 through 15.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one of more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B,""B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fail within the scope of that claim. Moreover, in the following claims, the terms "first," "second," and "third," etc. are used merely as labels, and are not intended to suggest a numerical order for their objects.

The embodiments as described above may be implemented in various hardware configurations that may include a processor for executing instructions that perform the techniques described. Such instructions may be contained in a machine-readable medium such as a suitable storage medium or a memory or other processor-executable medium.

The embodiments as described herein may be implemented in a number of environments such as part of a wireless local area network (WLAN), 3rd Generation Partnership Project (3GPP) Universal Terrestrial Radio Access Network (UTRAN), or Long-Term-Evolution (LTE) or a Long-Term-Evolution (LTE) communication system, although the scope of the invention is not limited in this respect. An example LTE system includes a number of mobile stations, defined by the LTE specification as User Equipment (UE), communicating with a base station, defined by the LTE specifications as an eNodeB.

Antennas referred to herein may comprise one or more directional or omnidirectional antennas, including, for example, dipole antennas, monopole antennas, patch antennas, loop antennas, microstrip antennas or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, antennas may be effectively separated to take advantage of spatial diversity and the different channel characteristics that may result between each of antennas and the antennas of a transmitting station. In some MIMO embodiments, antennas may be separated by up to $1/10$ of a wavelength or more.

In some embodiments, a receiver as described herein may be configured to receive signals in accordance with specific communication standards, such as the Institute of Electrical and Electronics Engineers (IEEE) standards including IEEE 802.11 standards and/or proposed specifications for WLANs, although the scope of the invention is not limited in this respect as they may also be suitable to transmit and/or receive communications in accordance with other techniques and standards. In some embodiments, the receiver may be configured to receive signals in accordance with the IEEE 802.16-2004, the IEEE 802.16(e) and/or IEEE 802.16 (m) standards for wireless metropolitan area networks (WMANs) including variations and evolutions thereof, although the scope of the invention is not limited in this respect as they may also be suitable to transmit and/or receive communications in accordance with other techniques and standards. In some embodiments, the receiver may be configured to receive signals in accordance with the Universal Terrestrial Radio Access Network (UTRAN) LTE communication standards. For more information with respect to the IEEE 802.11 and IEEE 802.16 standards, please refer to "IEEE Standards for Information Technology—Telecommunications and Information Exchange between Systems"—Local Area Networks—Specific Requirements—Part 11"Wireless LAN Medium Access Control (MAC) and Physical Layer (PHY), ISO/IEC 8802-11: 1999"and Metropolitan Area Networks—Specific Requirements—Part 16: "Air Interface for Fixed Broadband Wireless Access Systems." May 2005 and related amendments/versions. For more information with respect to UTRAN LTE standards, see the 3rd Generation Partnership Project (3GPP) standards for UTRAN-LTE, including variations and evolutions thereof.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure, for example, to comply with 37 C.F.R. § 1.72(b) in the United States of America. It is submitted with the understanding that it will not be used to interpret or limit the scope or meaning of the claims. Also, in the above Detailed Description, various features maybe grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. A method for operating a front-end unit communicating with a base-band unit (BBU) pool server and with a remote radio unit (RRU), comprising:
   receiving downlink physical channel data, downlink physical signals, and downlink control signaling (DCS) from the BBU pool server, mapping the downlink physical channel data and downlink physical signals to resource elements (REs) in accordance with the DCS, and transmitting corresponding downlink time-domain samples to the RRU; and,
   receiving up link time-domain samples from the RRU, extracting up link physical channel REs therefrom in accordance with uplink control signaling (UCS) received from the BBU pool server, and transmitting the uplink physical channel REs to a destination BBU pool server as specified by the UCS.

2. The method of claim 1 further comprising extracting from the uplink time-domain samples those REs of a physical uplink shared channel (PUSCH) that belong to an occupied resource block (RB) as indicated by the UCS.

3. The method of claim 1 further comprising:
   performing an inverse fast Fourier transform (IFFT) on the REs mapped from the downlink physical channel data and downlink physical signals and adding a cyclic prefix to generate corresponding downlink time-domain samples of an orthogonal frequency division multiple access (OFDMA) symbol for transmission to the RRU; and,
   extracting uplink physical channel REs from received uplink time domain samples by performing a fast Fourier transform (FFT) on time-domain samples belonging to a single carrier frequency-division multiple access (SC-FDMA) or OFDMA symbol with removal of a cyclic prefix.

4. The method of claim 1 wherein the downlink physical signals include reference signals (RSs), a primary synchronization signal (PSS), and a secondary synchronization signal (SSS).

5. The method of claim 4 further comprising:
   receiving and store the RSs, PSS, and SSS as unmodulated data; and,
   modulating the RSs, PSS, and SSS for mapping to REs according to an LTE radio frame number.

6. The method of claim 4 further comprising continuing to transmit downlink time-domain samples representing the RSs, PSS, and SSS to the RRU for subframes for which no DCS is received.

7. The method of claim 1 wherein the downlink physical channel data includes modulated and compressed complex-valued frequency-domain samples of a physical downlink shared channel (PDSCH) and unmodulated data corresponding to a physical downlink control channel (PDCCH).

8. A non-transitory computer-readable medium containing instructions for performing the method recited by claim 1.

9. A front-end unit to operate in an LTE (Long Term Evolution) network, comprising:
   interfaces to communicate with a base-band unit (BBU) pool server and with a remote radio unit (RRU);
   processing circuitry with an associated memory for storing downlink physical signals as received from the BBU pool server, wherein the processing circuitry is to:
   receive downlink physical channel data and downlink control signaling (DCS) from the BBU pool server, map the downlink physical channel data and physical signals retrieved from memory to resource elements (REs) in accordance with the DCS, OFDMA(orthogonal frequency division multiple access) modulate the REs to downlink time-domain samples, and transmit the downlink time-domain samples to the RRU; and
   receive uplink time-domain samples from the RRU, extract up link physical channel REs therefrom in accordance with uplink control signaling (UCS) received from the BBU pool server, and transmit the uplink physical channel REs to a destination BBU pool server as specified by the UCS.

10. The front-end unit of claim 9 wherein the processing circuitry is to extract from the uplink time-domain samples those REs of a physical uplink shared channel (PUSCH) that belong to an occupied resource block (RB) as indicated by the UCS.

11. The front-end unit of claim 9 wherein the processing circuitry is to:
  perform an inverse fast Fourier transform (IFFT) on the REs mapped from the downlink physical channel data and downlink physical signals and adding a cyclic prefix to generate corresponding downlink time-domain samples of an orthogonal frequency division multiple access (OFDMA) symbol for transmission to the RRU; and
  extract uplink physical channel REs from received uplink time domain samples by performing a fast Fourier transform (FFT) on time-domain samples belonging to a single carrier frequency-division multiple access (SC-FDMA) or OFDMA symbol with removal of a cyclic prefix.

12. The front-end unit of claim 9 wherein the downlink physical signals stored in memory include reference signals (RSs), a primary synchronization signal (PSS), and a secondary synchronization signal (SSS).

13. The front-end unit of claim 12 wherein the processing circuitry is to:
  receive and store the RSs, PSS, and SSS as unmodulated data; and,
  modulate the RSs, PSS, and SSS for mapping to REs according to the LTE radio frame number.

14. The front-end unit of claim 12 wherein the processing circuitry is to continue transmitting downlink time-domain samples representing the RSs, PSS, and SSS to the RRU for subframes for which no DCS is received.

15. The front-end unit of claim 9 wherein the downlink physical channel data includes modulated and compressed complex-valued frequency-domain samples of a physical downlink shared channel (PDSCH) and unmodulated data corresponding to a physical downlink control channel (PDCCH).

16. The front-end unit of claim 15 wherein the processing circuitry is to decompress the downlink PDSCH samples received from the BBU pool server before mapping them to REs.

17. The front-end unit of claim 16 wherein the compressed PDSCH samples are 16-bit complex numbers with an 8-bit in-phase component and an 8-bit quadrature component.

18. The front-end unit of claim 9 wherein the processing circuitry is to compress the uplink time-domain samples belonging to a physical up link shared channel (PUSCH) before transmitting them to the BBU pool server and wherein the compressed PUSCH samples are 16-bit complex numbers with an 8-bit in-phase component and an 8-bit quadrature component.

19. The front-end unit of claim 9 wherein the processing circuitry is to perform automatic On control (AGC) on the received uplink time-domain samples in accordance with an AGC coefficient included in the UCS.

20. The front-end unit of claim 9 wherein the processing circuitry is to, if a physical random access channel (PRACH) is enabled in a subframe as indicated by the UCS, extract PRACH data from the received time-domain samples and send the PRACH data to the BBU pool server.

* * * * *